United States Patent
Sofer et al.

(10) Patent No.: US 8,384,437 B2
(45) Date of Patent: Feb. 26, 2013

(54) METHOD AND APPARATUS FOR GATING A CLOCK SIGNAL

(75) Inventors: Sergey Sofer, Reshon Letzion (IL); Ami Dabush, Rishon-Lezion (IL); Michael Priel, Hertzelia (IL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/062,961

(22) PCT Filed: Sep. 15, 2008

(86) PCT No.: PCT/IB2008/053725
§ 371 (c)(1),
(2), (4) Date: Mar. 9, 2011

(87) PCT Pub. No.: WO2010/029389
PCT Pub. Date: Mar. 18, 2010

(65) Prior Publication Data
US 2011/0156752 A1   Jun. 30, 2011

(51) Int. Cl.
*H03K 19/00* (2006.01)

(52) U.S. Cl. ............................ 326/93; 326/94

(58) Field of Classification Search .................. None
See application file for complete search history.

(56) References Cited

U.S. PATENT DOCUMENTS

| | | | |
|---|---|---|---|
| 5,623,223 A | | 4/1997 | Pasqualini |
| 6,545,507 B1 * | | 4/2003 | Goller .............................. 326/93 |
| 7,068,080 B1 * | | 6/2006 | Sanders ............................ 327/99 |
| 7,109,776 B2 | | 9/2006 | Tschanz et al. |
| 7,863,955 B2 * | | 1/2011 | Kwon et al. .................... 327/175 |
| 2006/0061400 A1 * | | 3/2006 | Tschanz et al. ................ 327/291 |
| 2008/0074151 A1 | | 3/2008 | Kim |

OTHER PUBLICATIONS

International Search Report and Written Opinion correlating to PCT/IB2008/053725 dated Jun. 4, 2009.

* cited by examiner

*Primary Examiner* — Crystal L Hammond

(57) ABSTRACT

A semiconductor device comprising clock gating logic. The clock gating logic comprises clock freezing logic arranged to receive a selected clock signal and an enable signal. The clock freezing logic is further arranged to output a gated clock signal substantially corresponding to the selected clock signal when the enable signal comprises an inactive state, and to freeze the output gated clock signal when the enable signal comprises an active state. The clock gating logic further comprises polarity comparison logic arranged to compare polarities of an input clock signal and the gated clock signal and selector logic arranged to select from the input clock signal and an inverted input clock signal, based on a result of a comparison of the polarities of the input clock signal and the gated clock signal and to provide the selected clock signal to the clock freezing logic. The polarity comparison logic and the selector logic being further arranged such that, upon the enable signal transitioning from an active state to an inactive state, the selected clock signal provided to the clock freezing logic comprises a polarity substantially equivalent to that of the gated clock signal.

20 Claims, 5 Drawing Sheets

METHOD AND APPARATUS FOR GATING A CLOCK SIGNAL

FIELD OF THE INVENTION

The field of this invention relates to a method and apparatus for gating a clock signal, and in particular to a method and apparatus for gating a dual edge triggering clock signal.

BACKGROUND OF THE INVENTION

It is known that clocked components may consume a significant proportion of the total dynamic power of a functional unit, often in a range of 30%-50%. Dual Edge Triggering (DET) is a known technique for reducing the number of clock transitions, and thereby the power consumption, of clocked components. Unlike the more traditional Single Edge Triggering (SET), in which clocked components are triggered on just a single (e.g. rising or falling) transition edge of a clock signal, DET clocked components are triggered by both the rising and falling transition edges of the clock signal. In this manner, the clock signal may comprise half the transitions whilst still maintaining the same triggering rate for the clocked components. As a result, a power saving may be made in the region of 15%-25% of the total dynamic power of a function unit.

Another known technique for reducing the number of clock transitions of clocked components is to employ clock gating, whereby a clock signal for a clocked component may be 'gated', or frozen, when the toggling of the clocked component is not required. In this manner, power is not wasted by driving a clock signal for an idle component. Whilst the combination of clock gating with SET functional units is relatively simple to implement, the same is not true for the use of clock gating with DET functional units.

Another important usage of the clock gating technique is so called functional clock gating, where the sampling operations in the clocked components are blocked in order to obtain specific logic functionality, such as a stall of a core in a microprocessor unit when accessing a memory element etc. In this case, a strict number of blocked sampling operations, as well as their timing, is important, in contrary to the power saving clock gating.

FIG. 1 illustrates some of the problems encountered when clock gating is used in conjunction with DET functional units. Firstly, there is illustrated a full rate, or SET, clock signal CK 100. The SET clock signal CK 100 has been gated, or frozen, for one full rate clock cycle, as illustrated at 105. Accordingly, for the period illustrated, two sampling points 110, 115 are provided by the SET clock signal CK 100, instead of the three sampling points that would otherwise be provided without any gating.

Also illustrated is a first half rate, or DET, clock signal CKD 120. In the same manner as for the SET clock signal CK 100, the first DET clock signal CKD 120 has also been gated by the same apparatus (as the signal CK 100) for the same period of time. However, as can be seen, because of the half rate of the DET clock signal CKD, the DET clock signal CKD 120 misses not just the gated transition, but also the subsequent transition, since it already comprises the required state. Accordingly, for the period illustrated in FIG. 1, only one sampling point 125 is generated by the DET clock signal CKD 125, as opposed to the two generated by the SET clock signal CK 100. As a result, the un-gating of a DET clock signal in this manner can result in a latency of up to a complete half-rate clock cycle (two full-rate clock cycles).

A second half rate, or DET, clock signal CKD 130 is also illustrated in FIG. 1. Once again, the second DET clock signal CKD 130 has been gated for the same period of time. For this second DET clock signal CKD 130, when the clock signal 130 is un-gated, the clock signal is corrected in order to compensate for the clock signal 130 having an incorrect state. Accordingly, no transitions are missed, and the clock signal provides the two required sampling points 135, 140. However, in correcting the clock signal in order to compensate for the clock signal having the incorrect state, an additional transition is created, thereby generating a third, unwanted sampling point 145.

As will be appreciated by a skilled artisan, it is desirable not only to develop new clocked devices that utilise dual edge triggering in combination with clock gating, but also to be able to adapt existing single edge triggering clocked designs for use in dual edge triggering, clock gated components. However, the missing or unwanted sampling points resulting from gating dual edge triggering clock signals described above would likely require a significant re-design, especially considering the functional clock gating.

Typically, clock component circuit design is performed using a Register Transfer Level (RTL) description to describe the operation of synchronous digital circuits. In RTL design, a circuit's behaviour is defined in terms of the flow of signals (or transfer of data) between registers and the logical operations performed on those signals. Typically, RTL abstraction libraries are used within a hardware description language in order to simplify the design of clocked circuits by translating the logical operations to be performed into a gate level representation. However, as will be appreciated, the missing or unwanted sampling points resulting from gating dual edge triggering clock signals described above means that existing RTL libraries used for SET circuit design cannot be used for DET circuit design. Consequently, for DET circuit design, RTL modification is required on a more global level throughout the RTL libraries, which would also require long and costly logical verification.

FIG. 2 illustrates a proposed prior art solution to the problem of a gating cell causing missing and/or unwanted sampling points in a DET clock signal. The solution comprises a DET flip-flop 200 and an inverter 210. The DET flip-flop 200 receives a clock signal (clk) at its clock terminal and a gating signal at its enable terminal. The gating signal is 'active low' and 'inactive high'. The DET flip-flop 200 outputs a gated clock signal (Clkout) from its output terminal. Inverter 210 is connected to the output terminal and to a data terminal of the DET flip-flop 200 as illustrated. When the gating signal is inactive, the DET flip-flop outputs the value provided to its data terminal by the inverter 210 at each transition of the clock signal (clk). The inverter 210 inverts the signal. In this manner, whilst the gating signal is inactive, each transition of the clock signal causes the DET flip-flop to invert its output signal, and thus generate an output clock signal. However, when the gating signal becomes active, the DET flip-flop is gated, effectively freezing its output until the gating signal becomes inactive again, irrespective of the clock signal.

In this manner, the gating cell of FIG. 2 uses a flexible gated clock polarity, whereby the polarity of the gated clock signal (Clkout) is not dependent on the polarity of the input clock sign (clk). As a result, in theory, a transition should not be missed due to the output clock signal comprising an incorrect polarity, nor an extra transition created when attempting to correct for an incorrect polarity of the output clock signal.

FIG. 3 illustrates an example of the timing signals for the gating cell of FIG. 2. As can be seen, initially, whilst the enable signal 310 is inactive (high), the output (Q) 320 of the DET flip-flop 200 of FIG. 2 generally follows the input clock signal 300. The inverter 210 of FIG. 2 generates an inverted version of the output signal 330, which is provided to the input (D) 340 of the DET flip-flop.

In a practical implementation of the DET flip-flop 200, when the enable signal 310 is made active, the DET flip-flop 200 may gate the output signal in one of two ways. Firstly, and as illustrated in FIG. 3, the DET flip-flop 200 may internally "freeze" the data input 340. However, a problem with this approach is that, when the enable signal 330 is subsequently made active after the freezing of the data input 340, the data input 340 may have already taken on the inverted value of the output signal 320, as illustrated at 342. As a result, at the next clock transition, the output signal 322 may take on the now frozen value at the data input 340, as illustrated at 322. As a result, the output signal 320 may comprise an unwanted transition at 322 after the enable signal is made active. Furthermore, upon deactivation of the enable signal 310, since the output signal 320 will have transitioned after the input signal 340 was frozen, the output signal already equals the input signal. Consequently, if the enable signal is deactivated just before a transition within the clock signal 300, the increased (due to the freezing circuit components) delay in the input signal transitioning to the value provided by the inverter 210 may be sufficient to cause the output signal not to transition in time. In the other words, timing constraints to the enable signal, referring to the clock signal, may be unacceptably difficult. Accordingly, a transition in the output may be missed 325 following deactivation of the enable signal. Thus, this manner of gating the DET flip-flop 200 may still result in unwanted transitions, or a latency of up to a complete full rate clock cycle. In any case, such a circuit would not be able to gate one edge of the raw clock signal 300, making it unsuitable for functional clock gating.

As previously mentioned, in a practical implementation of the DET flip-flop 200 of FIG. 2, when the enable signal 310 of FIG. 3 is made active, the DET flip-flop 200 may gate the output signal in one of two ways. The second manner in which the DET flip-flop 200 may gate the output signal is by internally disabling the clock input signal. However, this would be equivalent to the initial DET clock gating problem stated above, and therefore would suffer from the same problems as illustrated in FIG. 1.

Thus, the proposed solution illustrated in FIG. 2 would still require a significant (re)design effort at the Register Transfer Level (RTL).

SUMMARY OF THE INVENTION

The present invention provides a method and apparatus for gating a clock signal as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 4:
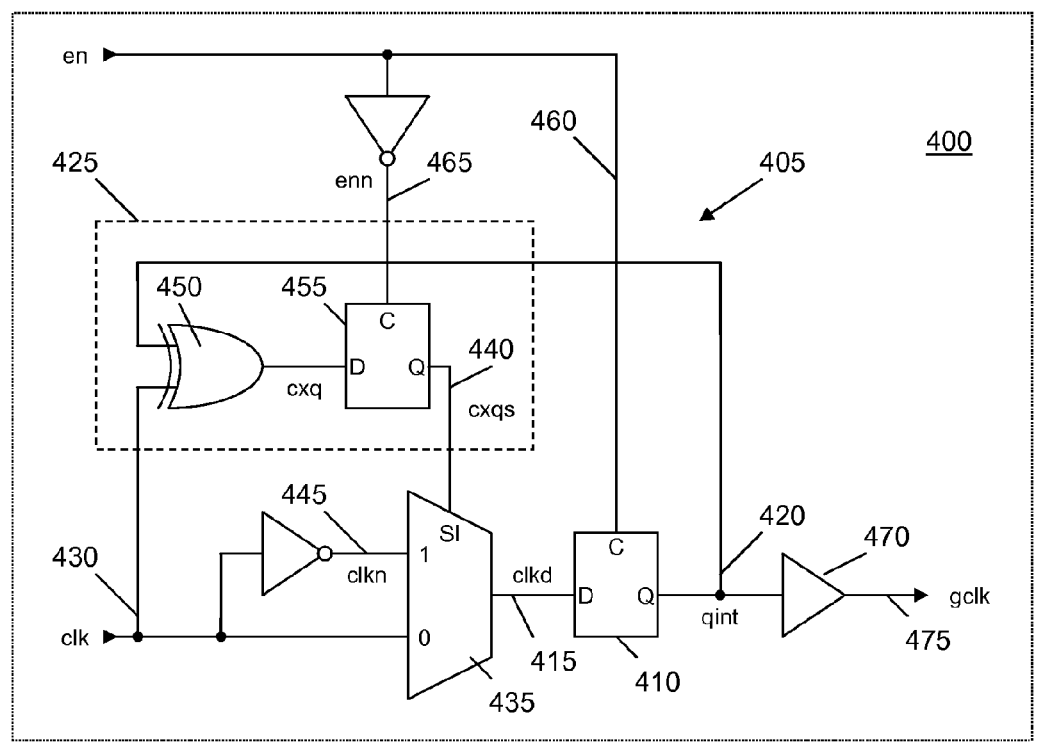
FIG. 4 illustrates a semiconductor device comprising an example of clock gating logic according to some embodiments of the invention.

Referring now to FIG. 4, there is illustrated a semiconductor device 400 comprising an example of clock gating logic 405, for example Dual Edge triggering (DET) clock gating logic, according to some embodiments of the invention. The clock gating logic 405 comprises clock freezing logic 410 arranged to receive a clock signal 415 comprising a selected polarity and an enable signal 460. The clock freezing logic 410 is further arranged to output a gated clock signal 420 substantially corresponding to the selected clock signal 415 when the enable signal 460 comprises an inactive state, and to freeze the output gated clock signal 420 when the enable signal 460 comprises an active state. The clock gating logic 405 further comprises polarity comparison logic 425 arranged to compare polarities of an input raw clock signal 430 and the gated clock signal 420, and selector logic 435 arranged to select from the input clock signal 430 and an inverted input clock signal 445. The selection is based on a result 440 of a comparison of the polarities of the input clock signal 430 and the gated clock signal 420. The selected clock signal 415 is provided to the clock freezing logic 410. The polarity comparison logic 425 and the selector logic 435 are further arranged such that, upon the enable signal 460 transitioning from an active state to an inactive state, the selected clock signal 415 provided to the clock freezing logic 410 comprises a polarity substantially equivalent to that of the gated clock signal 420.

In this manner, by providing a selected clock signal 415 comprising a polarity substantially equivalent to that of the gated clock signal 420 when the enable signal 460 is deactivated, the problem of missing sampling points resulting from the gated clock signal 420 comprising the incorrect state is substantially avoided. Accordingly, the gated clock signal 420 is limited to a maximum latency of half a half-rate clock cycle (one full-rate clock cycle). This is in contrast to the latency of one full half-rate clock cycle (two full-rate clock cycles) suffered by the prior art. In addition, no unwanted sampling points are created in an attempt to correct the state of the gated clock signal 420, in order to overcome the excessive latency.

Figure 1:
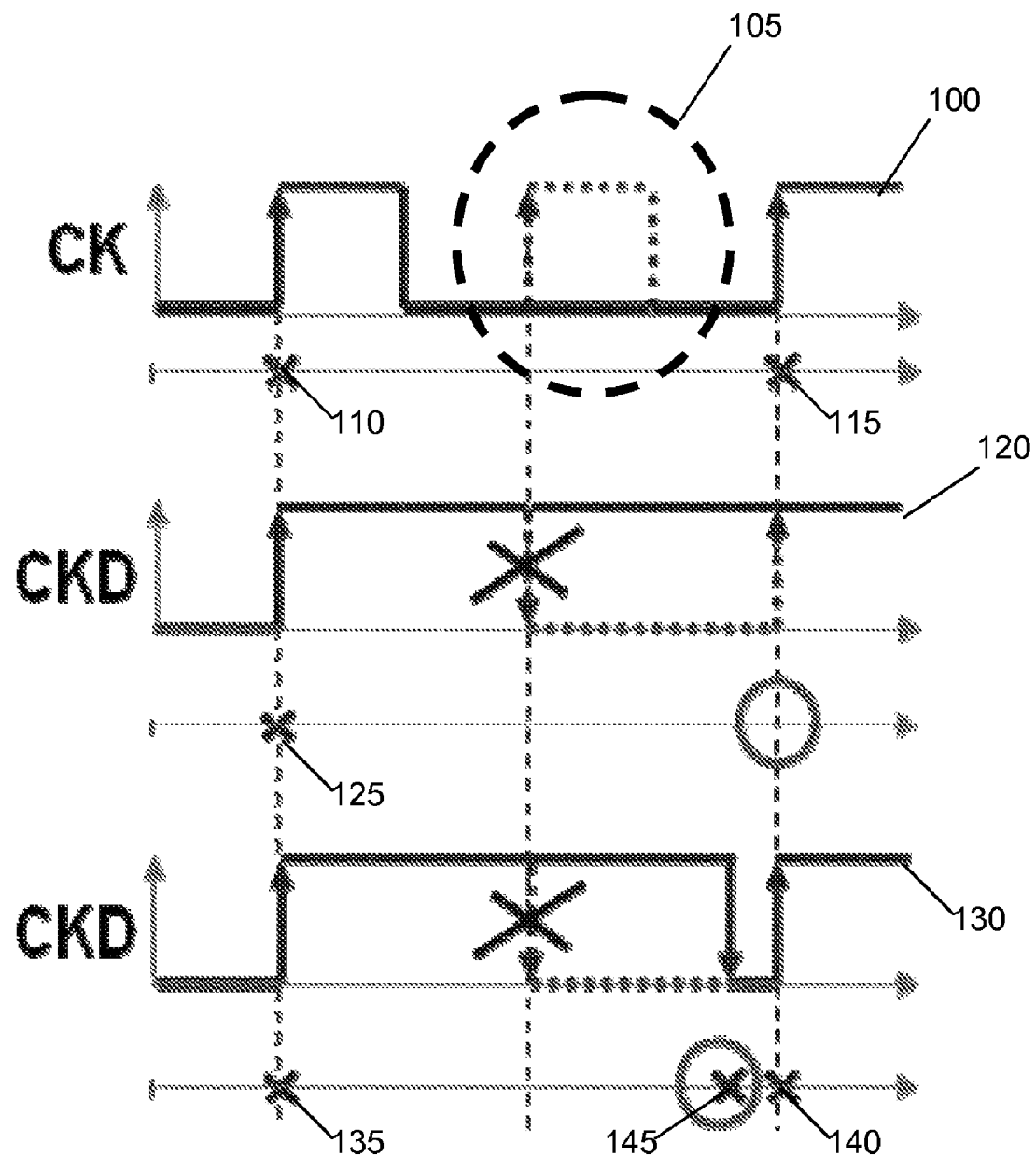
FIG. 1 illustrates examples of timing signals for gating single and dual edge triggering clock signals using known techniques.
Figure 2:
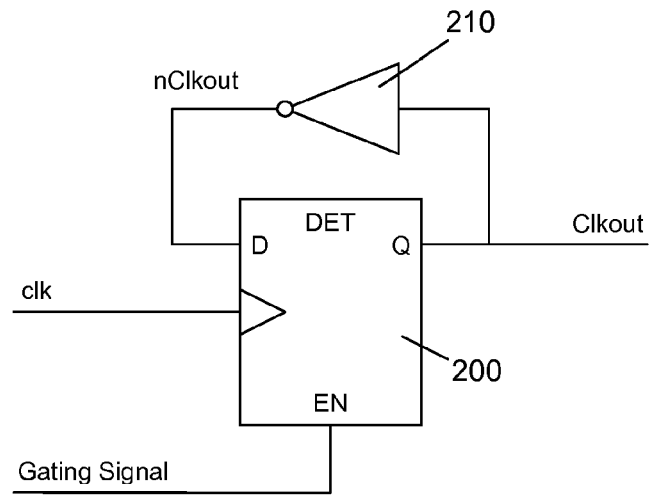
FIG. 2 illustrates a proposed prior art solution for gating a dual edge triggering clock signal.
Figure 3:
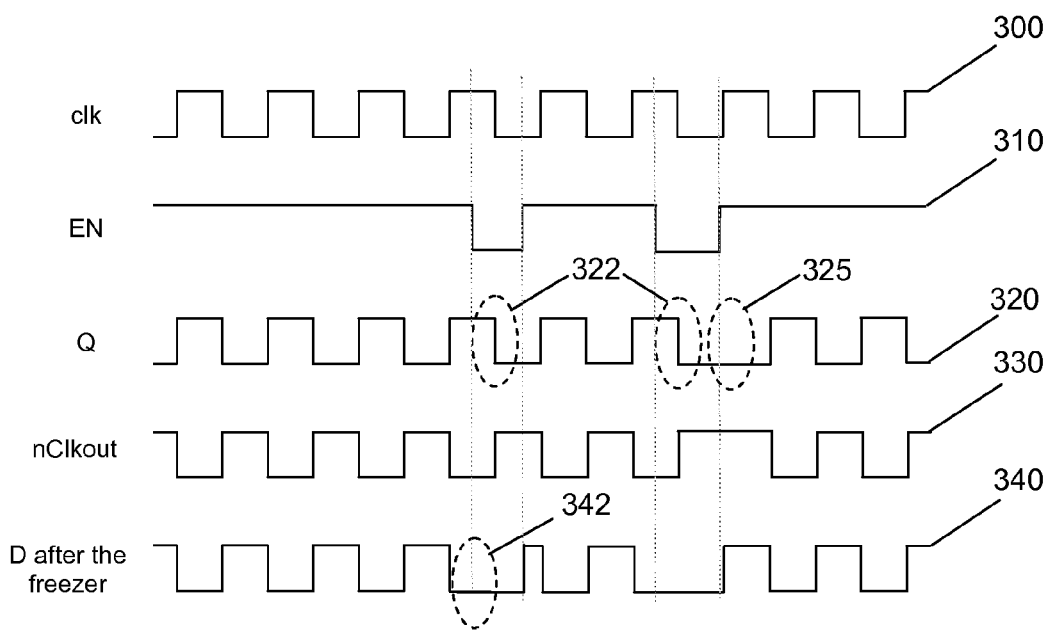
FIG. 3 illustrates an example of timing signals for the prior art solution of FIG. 1.

Furthermore, the clock freezing logic 410 is arranged to simply freeze and unfreeze a reference clock signal (selected clock signal 415) in response to the enable signal 460. This is in contrast to the proposed prior art solution of FIG. 2, where the DET flip-flop 200 freezes and unfreezes an input signal, the output of which is triggered by a separate clock signal. This use of separate input and clock signals by the prior art solution results in the output signal comprising an unwanted transition after the enable signal is made active, and a missing transition in the output following deactivation of the enable signal. Since the input signal and the clocking signal are in effect combined for the clock freezing logic 410 of FIG. 4, embodiments of the invention do not suffer from these same problems.

It is envisaged that the clock freezing logic 410 may comprise a logic latch controlled by the enable signal 460. In particular, the clock freezing logic 410 may comprise a level-sensitive (transparent when enabled) latch, as opposed to a clocked device. In this manner, when the enable signal 460 is in the inactive state, the output of the freezing logic 410 substantially follows the input of the freezing logic 410.

For the illustrated embodiment, the polarity comparison logic 425 comprises an exclusive OR (XOR) logic gate 450. The XOR gate 450 comprises a first input arranged to receive the input clock signal 430, and a second input arranged to receive the gated clock signal 420. In this manner, the XOR gate 450 is arranged to perform a comparison of the polarities of the input clock signal 430 and the gated clock signal 420, and in particular is arranged to determine whether or not the polarities of the input clock signal 430 and the gated clock signal 420 are matching.

The polarity comparison logic 425 of FIG. 4 further comprises a logic latch 455 arranged to receive as inputs the result of the comparison by the XOR gate 450 and an inverted enable signal 465. In this manner, the logic latch 455 is arranged to output a result 440 of a comparison of the polarities of the input clock 430 and the gated clock signal 420, substantially corresponding to the output of the XOR gate 450, when the enable signal 460 comprises an active state (for example when the inverted enable signal 465 comprises an inactive state). Furthermore, the logic latch 455 is arranged to freeze the outputted result 440 of a comparison of the polarities of the input clock signal 430 and the gated clock signal 420, when the enable signal 460 comprises an inactive state (for example when the inverted enable signal 465 comprises an active state). For the illustrated embodiment, the logic latch 455 comprises a level-sensitive (transparent when enabled) latch.

In this manner, when the enable signal 460 transitions from an active state to an inactive state, thereby causing the clock freezing logic 410 to unfreeze the output gated clock signal 420, the inverted enable signal 465 transitions from an inactive state to an active state, causing the logic latch 455 to freeze the outputted result 440 of the comparison of the polarities of the input clock signal 430 and the gated clock signal 420 at substantially the same moment. Consequently, the now frozen outputted result 440 of the comparison of the polarities of the input clock signal 430 and the gated clock signal 420 indicates whether or not the polarity of the frozen gated clock signal 420 matches that of the input clock signal 430.

For the embodiment illustrated in FIG. 4, the selector logic 435 comprises a multiplexer comprising a first input operably coupled to the input clock signal 430 and a second input operably coupled to the inverted input clock signal 445. The selector multiplexer 435 further comprises a control input arranged to receive the result 440 of a comparison of the polarities of the input clock signal 430 and the gated clock signal 420 output by the polarity comparison logic 425.

As previously mentioned, when the enable signal 460 transitions from an active state to an inactive state, causing the clock freezing logic 410 to unfreeze the output gated clock signal 420, the inverted enable signal 465 transitions from an inactive state to an active state. This transition causes the logic latch 455 of the polarity comparison logic 425 to freeze the outputted result 440 of the comparison of the polarities of the input clock signal 430 and the gated clock signal 420 at substantially the same moment. Consequently, the now frozen outputted result 440 of the comparison of the polarities of the input clock signal 430 and the gated clock signal 420 indicates whether or not the polarity of the frozen gated clock signal 420 matches that of the input clock signal 430.

In this manner, when the enable signal 460 transitions from an active state to an inactive state, causing the clock freezing logic 410 to unfreeze the output gated clock signal 420, the now frozen outputted result 440 of the comparison of the polarities of the input clock signal 430 and the gated clock signal 420 indicates whether or not the polarity of the frozen gated clock signal 420 matches that of the input clock signal 430. Accordingly, whilst the enable signal 460 remains in an inactive state, the frozen outputted result 440 causes the selector multiplexer 435 to select from the input clock signal 430 and the inverted input clock signal 445 the signal that comprises a polarity matching that of the output gated clock signal 420, at the time of the transition of the enable signal 460 from an active state to an inactive state. Thus, when the enable signal 460 transitions from an active state to an inactive state, causing the clock freezing logic 410 to unfreeze the output gated clock signal 420, the clock freezing logic 410 is provided with selected clock signal 415 comprising a polarity that matches that of the previously frozen output clock signal 420. Accordingly, when the output clock signal 420 is unfrozen, missing edges or unwanted redundant transition edges within the output clock signal 420 are substantially avoided. As a result, any latency in the gating and ungating of the output gated clock signal 420 may be limited to only a half a half-rate clock cycle (one full-rate clock cycle), which is equivalent to the performance typical of a Single Edge triggering (SET) clock gating technique.

As will be appreciated, the ability to provide clock gating for dual edge triggering clock signals with a latency equivalent to the performance typical of a single edge triggering clock gating technique, and without missing or unwanted transitions, enables existing clocked circuit designs to be easily converted from single edge triggering designs to dual edge triggering designs, with minimal (if any) RTL re-design necessary. Furthermore, those skilled in the art may notice that in many cases, a new logic synthesis stage may be avoided, and conversion of the functional unit design from the SET style to DET style may be limited to only a replacement of the SET clocked devices to DET clocked devices without any functional unit performance or functionality change. Accordingly, the power savings inherent from the use of dual edge triggering clock signals, and those from clock gating, may be achieved without significant development costs.

Figure 5:
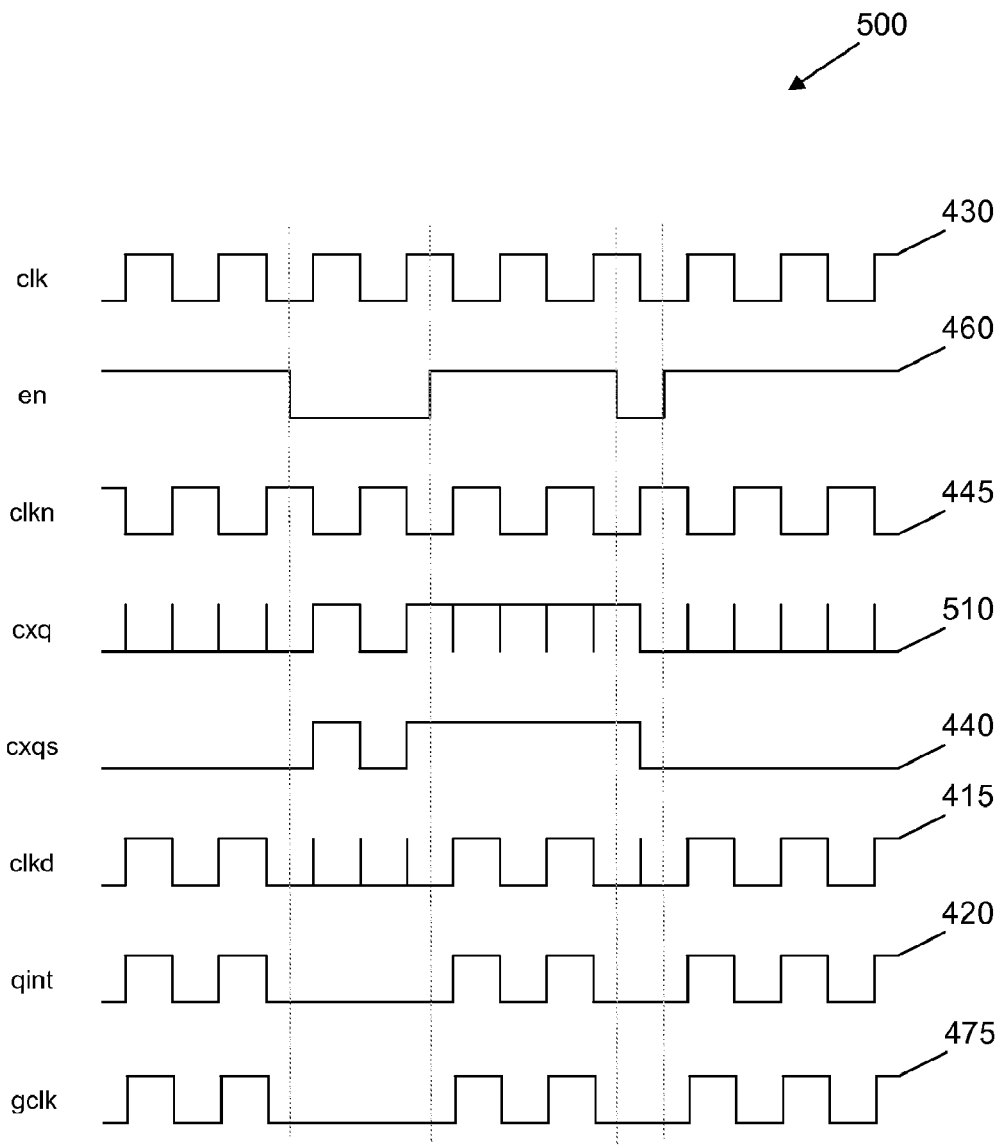
FIG. 5 illustrates an example of a timing diagram for the clock gating logic of FIG. 4 according to some embodiments of the invention.

Referring now to FIG. 5, there is illustrated an example of a timing diagram 500 for the clock gating logic 405 of FIG. 4. The timing diagram starts with the enable signal 460 inactive (high), and with the selected clock signal 415, and thereby the output gated clock signal 420 (and corresponding buffered signal 475) comprising a polarity matching that of the input raw clock signal 430.

When the enable signal 460 first transitions from inactive to active (low), the output clocked signal is frozen in a low' state. The output of the XOR gate 450, and similarly the output 440 of the logic latch 455 cycle from 'high' to low' as the polarity of the input clock signal 430 alternates between matching and not matching that of the output gated clock signal 410. As a result, the selected clock signal 415 becomes frozen in its current state.

When the enable signal 460 subsequently transitions from active to inactive, the output 440 of the logic latch 455 is frozen in a 'high' state, indicating that, at the moment when the enable signal 460 transitioned from active to inactive, the polarities of the input clock signal 430 and the output gated clock signal 420 did not match. Accordingly, the selected clock signal 415 settles in a 'high' state, thereby causing the output gated clock signal 420 to comprise a polarity opposing that of the input raw clock signal 430.

When the enable signal 460 transitions from inactive to active for the second time, the output clocked signal is again frozen in a low' state. However, when the enable signal 460 subsequently transitions from active to inactive again, the output 440 of the logic latch 455 is frozen in a low' state, indicating that, at the moment the when the enable signal 460 transitioned from active to inactive, the polarities of the input clock signal 430 and the output gated clock signal 420 matched. Accordingly, the selected clock signal 415 settles in a 'high' state, thereby causing the output gated clock signal 420 to comprise a polarity matching that of the input clock signal 430.

Those skilled in the art appreciate that any glitches, caused by either simultaneous changes of the XOR gate 450 inputs or multiplexer 435 selection control 440, when the values of corresponding signals are meaningful, are successfully blocked by the latch devices under given setup and hold constraints of the enable signal 460 with regard to the input raw clock signal 430, which do not exceed their equivalents in conventional SET-style design clock gating.

Figure 6:
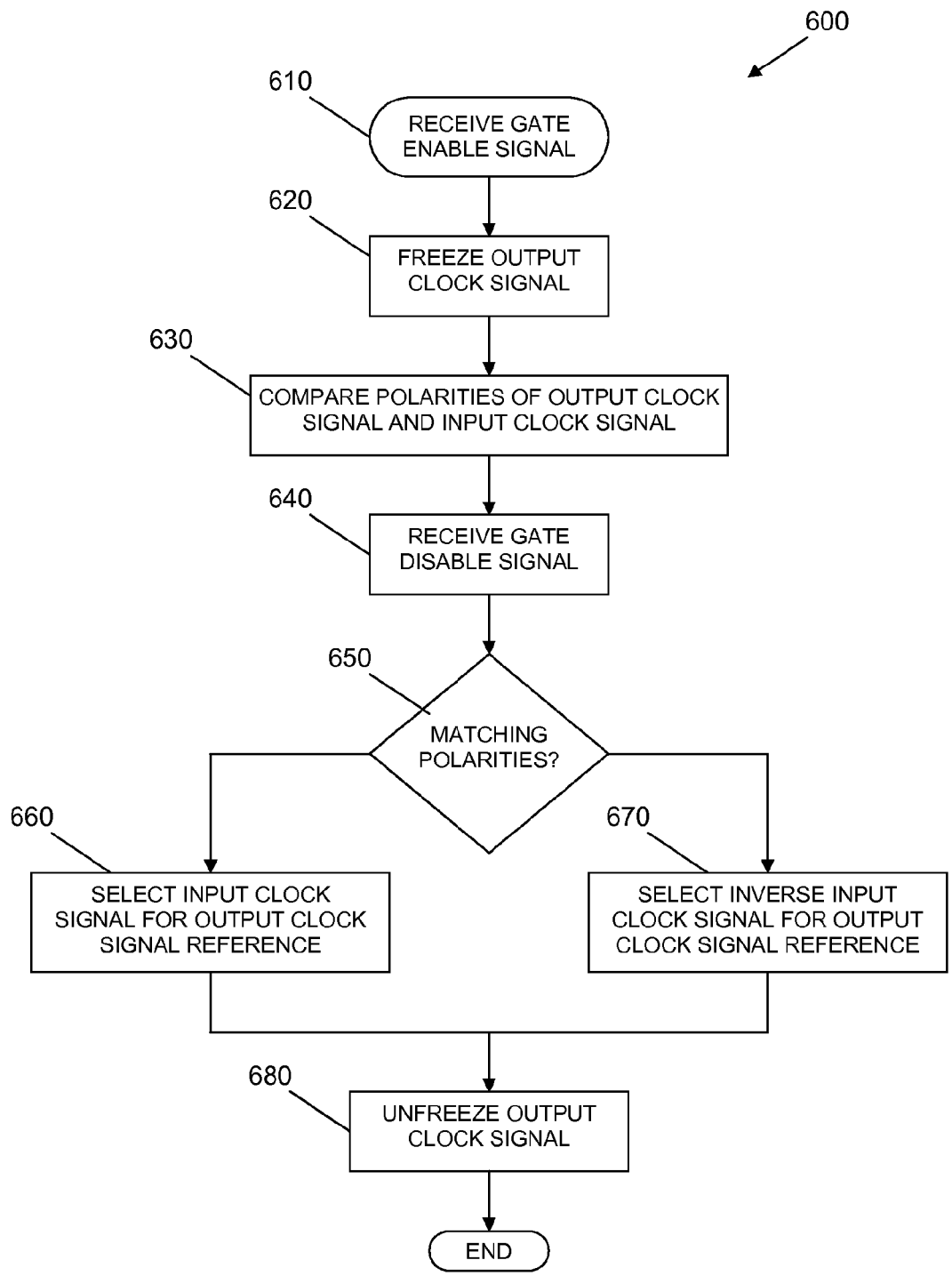
FIG. 6 illustrates an example of a simplified flowchart of a method for gating a clock signal according to some embodiments of the invention.

Referring now to FIG. 6, there is illustrated an example of a simplified flowchart 600 of a method for gating a clock signal, for example a dual edge triggering clock signal, according to some embodiments of the invention.

The method starts with receiving a gate enable signal at step 610. Next, in step 620, an output clock signal is frozen. For example, and as illustrated in FIG. 4, the gate enable signal may be applied to a transparent logic latch or similar component. Having frozen the output clock signal, the method moves to step 630, where polarities of the now frozen output clock signal and an input clock signal are compared. For example, and as illustrated in FIG. 4, an exclusive OR operation may be performed on the output clock signal and the input clock signal in order to indicate whether the output clock signal and the input clock signal comprise matching polarities.

Next, in step 640, a gate disable signal is received. Following receipt of the gate disable signal, it is determined whether the output clock signal and the input clock signal comprise matching polarities substantially at the moment of receipt of the gate disable signal, as shown in step 650. If it is determined that substantially at the moment of receipt of the gate disable signal that the polarities of the output clock signal and input clock signal match, the method moves to step 660, with the selection of the input clock signal for use as an output clock signal reference. Conversely, if it is determined that substantially at the moment of receipt of the gate disable signal that the polarities of the output clock signal and input clock signal do not match, the method moves to step 670, with the selection of an inverse input clock signal. The inverse input clock signal comprises a polarity substantially opposing that of the input clock signal, for use as an output clock signal reference. Alternatively, the step 640 may come after the selection steps 650, 660 and/or 670 with no any functionality or performance impact. The method then ends at step 680.

As will be appreciated, embodiments of the present invention, such as those examples illustrated and described herein, may provide one or more of:

Clock gating logic capable of gating a dual edge triggering clock signal with a latency of only half a half-rate clock cycle (corresponding to the one full-rate clock cycle);

(ii) Clock gating logic capable of gating a dual edge triggering clock signal without causing missing or unwanted transitions;

(iii) Enabling a reduction in a region of 15% to 25% that of total dynamic power of a clocked function unit; and (iv) Fluent conversion of existing clocked circuit designs from single edge triggering designs to dual edge triggering designs, requiring minimal RTL re-design or in some cases sequential logic gates replacement only.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, Other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A semiconductor device comprising clock gating logic, the clock gating logic comprising:
    clock freezing logic arranged to receive a clock signal comprising a selected clock polarity and an enable signal, and output a gated clock signal substantially corresponding to a selected clock signal when the enable signal comprises an inactive state, and to freeze the output gated clock signal when the enable signal comprises an active state;
    polarity comparison logic arranged to compare polarities of an input clock signal and the gated clock signal; and
    selector logic arranged to select from the input clock signal and an inverted input clock signal, based on a result of the comparison of the polarities of the input clock signal and the gated clock signal and to provide the selected clock signal to the clock freezing logic;
    wherein the polarity comparison logic and the selector logic are further arranged such that, upon the enable signal transitioning from the active state to the inactive state, the selected clock signal provided to the clock freezing logic comprises a polarity substantially equivalent to that of the gated clock signal.

2. The semiconductor device of claim 1 wherein the clock gating logic comprises dual edge triggering (DET) clock gating logic.

3. The semiconductor device of claim 2 wherein the clock freezing logic comprises a logic latch controlled by the enable signal.

4. The semiconductor device of claim 2 wherein the polarity comparison logic comprises an XOR logic gate arranged to perform the comparison of the polarities of the input clock signal and the gated clock signal.

5. The semiconductor device of claim 2 wherein the selector logic comprises a multiplexer comprising a first input operably coupled to the input clock signal, and a second input operably coupled to the inverted input clock signal; the multiplexer further comprising a control input arranged to receive the result of a comparison of the polarities of the input clock signal and the gated clock signal output by the polarity comparison logic.

6. The semiconductor device of claim 1 wherein the clock freezing logic comprises a logic latch controlled by the enable signal.

7. The semiconductor device of claim 6 wherein the clock freezing logic comprises a level-sensitive logic latch controlled by the enable signal.

8. The semiconductor device of claim 7 wherein the polarity comparison logic comprises an XOR logic gate arranged to perform the comparison of the polarities of the input clock signal and the gated clock signal.

9. The semiconductor device of claim 6 wherein the polarity comparison logic comprises an XOR logic gate arranged to perform the comparison of the polarities of the input clock signal and the gated clock signal.

10. The semiconductor device of claim 1 wherein the polarity comparison logic comprises an XOR logic gate arranged to perform the comparison of the polarities of the input clock signal and the gated clock signal.

11. The semiconductor device of claim 10 wherein the polarity comparison logic further comprises a level sensitive logic latch arranged to receive as inputs the result of the comparison by the XOR logic gate and an inverted enable signal.

12. The semiconductor device of claim 11 wherein the level sensitive logic latch is further arranged to output the result of the comparison of the polarities of the input clock signal and the gated clock signal corresponding to the output of the XOR logic gate when the enable signal comprises the active state.

13. The semiconductor device of claim 12 wherein the level sensitive logic latch is further arranged to freeze the output result of the comparison of the polarities of the input clock signal and the gated clock signal when the enable signal comprises the inactive state.

14. The semiconductor device of claim 13 wherein the level sensitive logic latch of the polarity comparison logic comprises a transparent logic latch.

15. The semiconductor device of claim 12 wherein the level sensitive logic latch of the polarity comparison logic comprises a transparent logic latch.

16. The semiconductor device of claim 11 wherein the level sensitive logic latch of the polarity comparison logic comprises a transparent logic latch.

17. The semiconductor device of claim 1 wherein the polarity comparison logic further comprises a level sensitive logic latch arranged to receive as inputs the result of the comparison of the polarities of the input clock signal and the gated clock signal and an inverted enable signal.

18. A semiconductor device comprising clock gating logic, the clock gating logic comprising:
    clock freezing logic arranged to receive a clock signal comprising a selected clock polarity and an enable signal, and output a gated clock signal substantially corresponding to a selected clock signal when the enable signal comprises an inactive state, and to freeze the output gated clock signal when the enable signal comprises an active state;
    polarity comparison logic arranged to compare polarities of an input clock signal and the gated clock signal; and selector logic arranged to select from the input clock signal and an inverted input clock signal, based on a result of the comparison of the polarities of the input clock signal and the gated clock signal and to provide the selected clock signal to the clock freezing logic;

wherein the polarity comparison logic and the selector logic are further arranged such that, upon the enable signal transitioning from the active state to the inactive state, the selected clock signal provided to the clock freezing logic comprises a polarity substantially equivalent to that of the gated clock signal;

wherein the selector logic comprises a multiplexer comprising a first input operably coupled to the input clock signal, and a second input operably coupled to the inverted input clock signal; the multiplexer further comprising a control input arranged to receive the result of the comparison of the polarities of the input clock signal and the gated clock signal output by the polarity comparison logic.

19. A method for gating a clock signal, the method comprising the steps of:

receiving a gate enable signal;

freezing an output clock signal;

comparing polarities of the output clock signal and an input clock signal;

receiving a gate disable signal;

if, substantially at receipt of the gate disable signal, the polarities of the output clock signal and the input clock signal match, selecting the input clock signal for use as an output clock signal reference; or if, substantially at receipt of the gate disable signal, the polarities of the output clock signal and the input clock signal do not match, selecting an inverse input clock signal for use as the output clock signal reference; and unfreezing the output clock signal.

20. The method of claim 19 further comprising:

receiving, at a first input of a multiplexer of the selector logic, the input clock signal;

receiving, at a second input of the multiplexer, the inverted input clock signal; and receiving, at a control input of the multiplexer, the result of the comparison of the polarities of the input clock signal and the gated clock signal output by the polarity comparison logic.

* * * * *